United States Patent
Griswold et al.

(10) Patent No.: US 7,863,893 B2
(45) Date of Patent: Jan. 4, 2011

(54) DYNAMIC PMRI USING GRAPPA-OPERATOR WITH UNDER-SAMPLED TIME INTERLEAVED FRAMES

(75) Inventors: Mark A. Griswold, Shaker Heights, OH (US); Martin Blaimer, Würzburg (DE)

(73) Assignee: Case Western Reserve University, Cleveland, OH (US)

( * ) Notice: Subject to any disclaimer, the term of this patent is extended or adjusted under 35 U.S.C. 154(b) by 233 days.

(21) Appl. No.: 12/150,839

(22) Filed: May 1, 2008

(65) Prior Publication Data

US 2008/0278160 A1 Nov. 13, 2008

Related U.S. Application Data

(60) Provisional application No. 60/927,183, filed on May 2, 2007.

(51) Int. Cl.
*G01V 3/00* (2006.01)
(52) U.S. Cl. .................. 324/307; 324/309; 324/318
(58) Field of Classification Search ......... 324/300–322; 600/410, 411, 412, 422; 382/128–131
See application file for complete search history.

(56) References Cited

U.S. PATENT DOCUMENTS

| | | | |
|---|---|---|---|
| 7,394,252 B1 * | 7/2008 | Lin | 324/309 |
| 7,511,495 B2 * | 3/2009 | Kholmovski et al. | 324/310 |
| 7,592,809 B1 * | 9/2009 | King et al. | 324/309 |
| 2008/0021304 A1 * | 1/2008 | Stemmer | 600/410 |
| 2008/0242972 A1 * | 10/2008 | Jung et al. | 600/410 |
| 2008/0278160 A1 * | 11/2008 | Griswold et al. | 324/307 |
| 2009/0024759 A1 * | 1/2009 | McKibben et al. | 709/238 |
| 2009/0092303 A1 * | 4/2009 | Griswold et al. | 382/131 |
| 2009/0134870 A1 * | 5/2009 | Jellus | 324/309 |
| 2009/0262996 A1 * | 10/2009 | Samsonov et al. | 382/130 |

* cited by examiner

*Primary Examiner*—Brij B. Shrivastav
*Assistant Examiner*—Tiffany A Fetzner
(74) *Attorney, Agent, or Firm*—Kraguljac & Kalnay, LLC

(57) ABSTRACT

Example systems, methods, and apparatus facilitate providing a k-space line that is missing in an under-sampled time frame. The missing line is computed by applying a GRAPPA-operator to a known k-space line in the under-sampled time frame. One example method includes controlling a dynamic parallel magnetic resonance imaging (DpMRI) apparatus to acquire a first under-sampled time interleaved frame having at least one first k-space line and controlling the DpMRI apparatus to acquire a second under-sampled time interleaved frame having at least one second k-space line that neighbors the first k-space line. The method includes assembling a reference data set from the first under-sampled time frame and the second under-sampled time frame and then determining the GRAPPA-operator from neighboring k-space lines in the reference data set.

18 Claims, 9 Drawing Sheets

$$G^2 = G^1 G^1$$

$$G^3 = G^2 G^1 = G^1 G^1 G^1$$

DYNAMIC PMRI USING GRAPPA-OPERATOR WITH UNDER-SAMPLED TIME INTERLEAVED FRAMES

CROSS REFERENCE TO RELATED APPLICATIONS

This application claims the benefit of U.S. Provisional Patent 60/927,183, filed May 2, 2007, by the same inventors.

COPYRIGHT NOTICE

A portion of the disclosure of this patent document contains material that is subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

Dynamic magnetic resonance imaging (MRI) involves creating a sequence of magnetic resonance (MR) images to monitor temporal changes in an object of interest (e.g., tissue structure). Dynamic MRI apparatus seek to acquire images as fast as possible while maintaining a sufficient signal to noise ratio (SNR) to investigate the object being imaged. Thus, image acquisition acceleration techniques may be employed. In one example, a reference data set may be created by under-sampling k-space and recording images simultaneously from multiple imaging coils. For example, partial parallel acquisition (PPA) strategies (e.g., sensitivity encoding (SENSE), generalized auto-calibrating partially parallel acquisition (GRAPPA)) facilitate accelerating image acquisition and are therefore employed in dynamic MRI.

Time-adaptive SENSE (TSENSE) and temporal GRAPPA (TGRAPPA) have also been employed in dynamic MRI. Both TSENSE and TGRAPPA are based on a time-interleaved phase encoding scheme. Conventionally, to support achieving an acceleration factor of R, raw data from R or more under-sampled time frames (e.g., frames that do not satisfy the Nyquist criteria) are assembled to obtain a reference data set that does satisfy the Nyquist criteria. The reference data set is used to calculate parameters (e.g., weights, coil sensitivity profiles) used in parallel image reconstruction. These parameters can then be used to reconstruct individual under sampled time frames. It may take a long time to acquire the reference data set due, for example, to long dynamic frames. Therefore the reference data set may be corrupted due, for example, to motion that occurs during acquisition.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example systems, methods, and apparatus concern dynamic parallel MRI (DpMRI) involving the GRAPPA-operator (Gopr). In one example, two dimensional (2D) reconstruction parameters associated with DpMRI with an acceleration factor R>2 can be computed from two under-sampled interleaved time frames. Additionally, three dimensional (3D) reconstruction parameters associated with dynamic pMRI with an acceleration factor R>3 can be computed from three under-sampled interleaved time frames.

Figure 1:
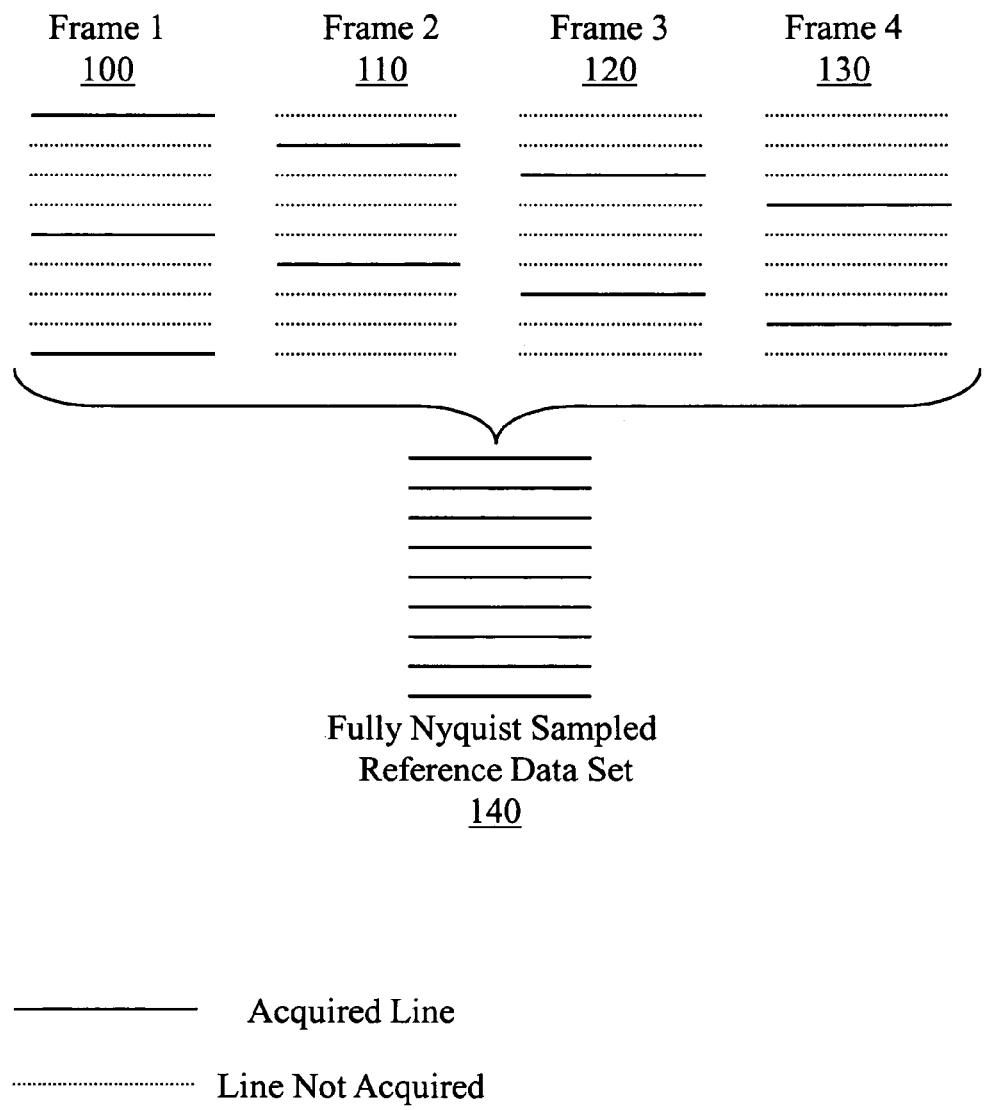
FIG. 1 illustrates a conventional acquisition scheme for dynamic parallel magnetic resonance imaging (DpMRI).

FIG. 1 illustrates acquisition of interleaved time frames associated with a conventional acquisition scheme for DpMRI. At a first time, frame 1 100 is acquired and at a second later time frame 2 110 is acquired. In example systems, a GRAPPA-operator can be computed from information available in just frame 1 100 and frame 2 110. However, in conventional systems, frame 3 120 and frame 4 130 are acquired at later times. A fully Nyquist sampled reference data set 140 is therefore available for conventional systems. Reconstruction parameters (e.g., weights) for a parallel reconstruction procedure (e.g., GRAPPA) can then be computed from the fully sampled data set 140.

pMRI data are collected in the spatial frequency domain (k-space). Scan time is related to the number of data samples collected from k-space. The number of data samples required is related to reconstruction approaches and to calibration approaches. These approaches are governed, at least in part, by the Nyquist criterion. In FIG. 1, a fully sampled data set 140 is acquired. However, k-space can be under-sampled, which involves collecting fewer data samples than necessary to satisfy the Nyquist criterion. Under-sampling, without additional processing, can force Fourier Transform (FT) reconstructions to exhibit aliasing artifacts. However, reconstruction parameters can be computed from combinations of under-sampled data to mitigate the effects of under-sampling. Example systems and methods present a GRAPPA-operator to improve image reconstruction from under sampled data.

Figure 2:
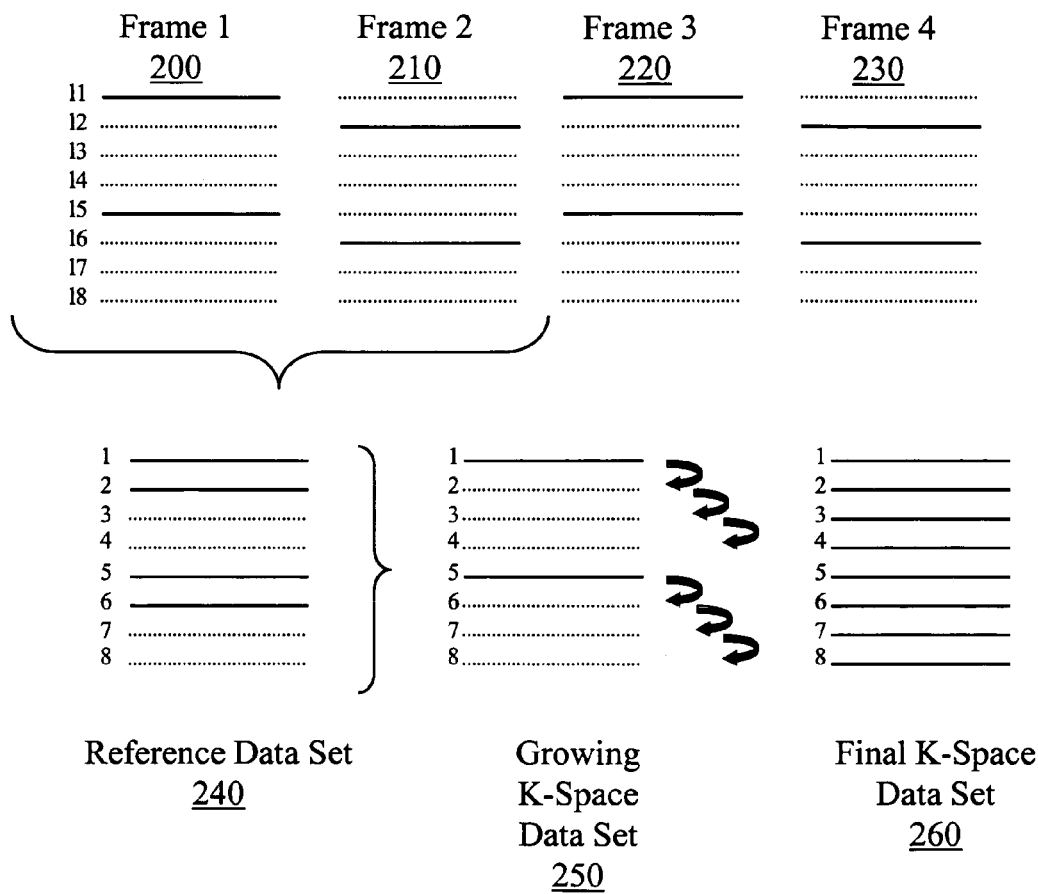
FIG. 2 illustrates an acquisition scheme for DpMRI using the GRAPPA-operator technique.

FIG. 2 illustrates acquisition of interleaved time frames associated with DpMRI that uses the Gopr technique to determine missing data using less than a completely sampled reference data set. In FIG. 2, an incomplete reference data set 240 is assembled from just two time interleaved data sets (e.g., Frame 1 200, Frame 2 210). The under-sampling represented in FIG. 2 produces an acceleration factor of R=4. By analyzing the relationship between I1 and I2, information can be acquired to fill in missing lines (e.g., I3, I4, I7, I8). However, since information can also be acquired concerning the relationship between I5 and I6, that information may be used to fill in missing lines I7 and I8. One skilled in the art will appreciate that information from sets of neighboring lines can be employed to fill in missing lines elsewhere in the under sampled data set. FIG. 2 illustrates frame 3 220 being acquired at time T3 and frame 4 230 being acquired at time t4. However, frame 3 220 collects the same lines as frame 1 200 and frame 4 230 collects the same lines as frame 2 210. Therefore, the dynamic property of DpMRI may be enhanced since a line may be sampled more times in a period of time than is possible in conventional systems. While a k-space "line" is described, it is to be appreciated that in different examples a "line" may refer to a set of points associated with a Cartesian acquisition or with a non-linear acquisition.

In GRAPPA, a missing k-space data point in a single coil can be reconstructed by a linear combination of acquired data points from other coils. The conventional one dimensional (1D) GRAPPA reconstruction is described by:

$$S(k_y + m\Delta k_y) = \hat{G}_{y,m} \cdot S(k_y), m = 1 \ldots (R-1)$$

The vector $S(k_y)$ contains the acquired signal associated with the k-space location $k_y$, the signal being received in $N_c$ coils. The vector $S(k_y)$ has the length $N_c$. The vector $S(k_y + m\Delta k_y)$, of length $N_c$, contains the reconstructed signals at location $k_y + m\Delta k_y$ in the $N_c$ coils.

The weighting matrix $\hat{G}_{y,m}$, with size $N_c \times N_c$, contains coil weighting factors. In conventional GRAPPA, a weighting matrix can be calculated if fully sampled reference data are available such that $S(k_y)$ and $S(k_y + m\Delta k_y)$ are known for desired shifts m, by solving:

$$\hat{G}_{y,m} = S(k_y + m\Delta k_y) \cdot (S(k_y)^H S(k_y))^{-1} (S(k_y)^H)$$

However, this conventional GRAPPA approach requires a complete set of reference data that satisfies the Nyquist criterion.

Example systems and methods use an incomplete reference data set (e.g., data set 240) to calculate reconstruction parameters based on fitting neighboring k-space lines (e.g., I1-2, I5-6). While analyzing the relationship between I1-2 in the reference data set 240 theoretically provides knowledge to do complete reconstruction in an under-sampled frame (e.g., fill I2-4, I6-8), there is also information available about a second relationship between I5-6 in the reference data set. Therefore, in one example that uses all available information, the second relationship will also be used to fill missing lines to facilitate computing reconstruction parameters. The computed reconstruction parameters can then be applied to the raw data of an under-sampled individual frame (e.g., frame 1 200) to grow a reference data set 250 by filling in missing lines and finally to obtain a final data set 260. While a complete data set 260 is illustrated, it is to be appreciated that a less than complete data set 260 may be created by iteratively applying information gathered from relationships between lines in the under sampled data space. Additionally, when parallel processing is available, growing reference data set 250 may be grown in parallel.

As described above, GRAPPA reconstruction typically requires a complete set of reference data for a shift in direction. By contrast, only one set of weights (reconstruction parameters) are needed by the Gopr technique to reconstruct a missing line from an acquired line since GRAPPA reconstruction can be reformulated as a matrix operator that shifts data in k-space. Once a first shift amount is determined, another shift amount can be determined by repeated applications of the first shift amount. Thus, if a conversion is known for two neighboring (e.g., adjoining) lines, then a conversion for more distant lines can be determined from the known conversion. Thus, an entire reference data set is not required.

Consider the following equation for determining a signal at a missing location $S_j(k_y + m\Delta k_y)$ based on an acquired signal:

$$S_j(k_y + m\Delta k_y) = \sum_{l=1}^{L} n(j, b, l, m) S_l(k_y + b A \Delta k_y)$$

$S_j(k_y)$ contains individual coil signals, and $n(j,b,l,m)$ represent reconstruction weights. The acquired signal at some position k in k-space in each coil j of the array is given by $S(j,k)$. k is a vector that specifies the multi-dimensional location in k-space $(k_x, k_y, k_z)$. For L coils, the 2D matrix is sized $L \times N_k$, where $N_k$ is the total number of k-space points in the image. Thus, the GRAPPA formulation can be converted to:

$$S_{(j,k+\Delta k)} = G_1 S_{(j,k)}$$

where the set of weights $G_1$ corresponds to $n(j,b,l,m)$ for $b=1$, $m=1$, so that the individual rows of the $L \times LG$ matrix are the GRAPPA weights used to reconstruct the shifted line $S_{(j,k+\Delta k)}$ in each respective coil.

Example systems and methods generalize the above calculations to describe an infinitesimal shift to derive a set of weights $G_\delta$ with a small shift of δ. The generalization can be described according to:

$$S_{(j,k+\delta)} = G_\delta S_{(j,k)}$$

With this generalized shift described, other shifts can then be made through multiple applications of the weights matrix $G_\delta$. Therefore, example systems and methods manipulate the GRAPPA fit process to produce an operator for shifting data in k-space. For example, if $G_1$ shifts the signal by $\Delta k$, a shift by $m\Delta k$ is achieved by applying $G_1$ m-times: $S_{(j,k+m\Delta k)} = (G_1)^m \cdot S_{(j,k)}$. This is referred to as the GRAPPA-operator (Gopr).

FIG. 2 illustrates how two under-sampled interleaved time frames (e.g., Frame 1 200, Frame 2 210) are assembled to obtain an incomplete reference ACS data set 240 that can be used in DpMRI. Information is gathered about the relationship between neighboring lines in the ACS reference data set 240. The reference data set 240 is used to calculate reconstruction parameters for a Gopr reconstruction. The parameters are then used to reconstruct the missing data in the individual under-sampled time frames. The approach can be extended to three dimensional (3D) imaging with imaging accelerations along the phase-encoding and the 3D-encoding direction. For 3D imaging, raw data from three individual under-sampled time frames is assembled to calculate a reference data set. Reconstruction parameters for a Gopr reconstruction are then computed from the reference data set. The reconstruction completes the missing data in the individual under-sampled time frames by applying the Gopr to known lines. In different examples, the approach illustrated in FIG. 2 can be employed with both conventional time-interleaved acquisition schemes and modified time-interleaved acquisition schemes.

Figure 3:
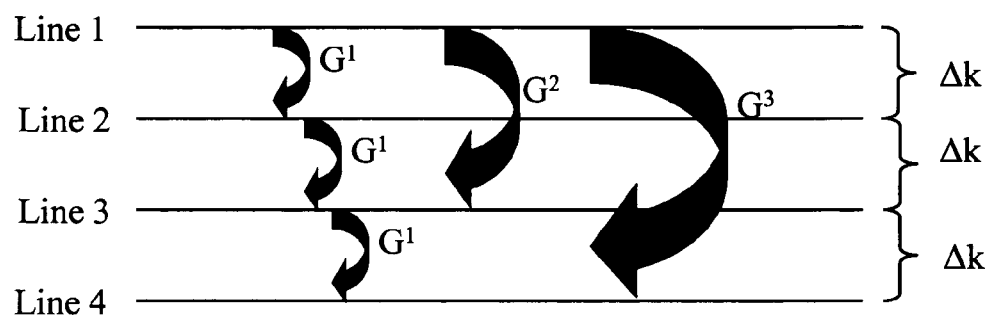
FIG. 3 illustrates concepts associated with the GRAPPA-operator.

FIG. 3 illustrates repetitive application of the Gopr to fill in distant (e.g., non-adjacent) missing lines. If a conversion from line 1 to line 2 is known, then the conversion from line 2 to line 3, and from line 3 to line 4 is also known. Additionally, a conversion from line 1 to line 3 and from line 1 to line 4 can be derived from the known conversion between line 1 and line 2. If a set of weights (e.g., $G_1$) is known for a conversion between neighboring lines, then these weights can be used for conversion between other neighboring lines.

Additionally, these weights can be used for conversion between more distant lines. Using the Gopr, only one set of weights between neighboring lines allows reconstruction of missing lines. Therefore, in DpMRI, fewer time interleaved frames may be assembled to calculate the reconstruction parameters (coil weights), thereby reducing motion related artifacts from the reconstruction. While FIG. 3 illustrates repetitive application of $G^1$ to produce $G^2$ and $G^3$, it is to be appreciated that weights for a larger $\Delta K$ could be computed by acquiring neighboring lines that are more distant. For example, the larger $\Delta K$ could be acquired by analyzing the difference between "adjacent" lines that are separated by a larger distance than the "adjacent" lines analyzed to produce the smaller $\Delta k$. With both $\Delta k$ and $\Delta K$ available, multiple missing lines could be filled in parallel by applying the weights for both $\Delta k$ and $\Delta K$ to a known line.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
DVD: digital versatile disk and/or digital video disk.
HTTP: hypertext transfer protocol.
LAN: local area network.
PCI: peripheral component interconnect.
PCIE: PCI express.
RAM: random access memory.
DRAM: dynamic RAM.
SRAM: synchronous RAM.
ROM: read only memory.
PROM: programmable ROM.
USB: universal serial bus.
WAN: wide area network.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer communication", as used herein, refers to a communication between computing devices (e.g., computer, personal digital assistant, cellular telephone) and can be, for example, a network transfer, a file transfer, an applet transfer, an email, an HTTP transfer, and so on. A computer communication can occur across, for example, a wireless system (e.g., IEEE 802.11), an Ethernet system (e.g., IEEE 802.3), a token ring system (e.g., IEEE 802.5), a LAN, a WAN, a point-to-point system, a circuit switching system, a packet switching system, and so on.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a list, a queue, a heap, a memory, a register, and so on. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"Software", as used herein, includes but is not limited to, one or more executable instruction that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, and/or programs including separate applications or code from dynamically linked libraries.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 4:
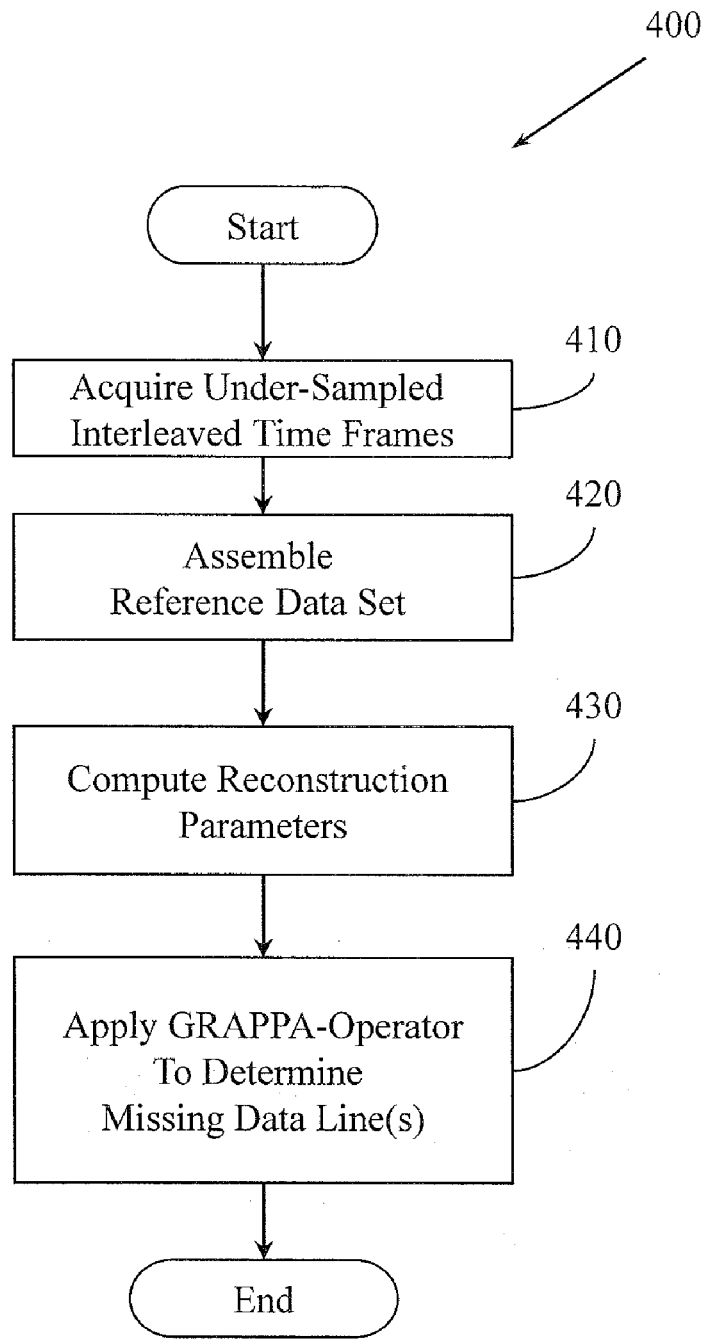
FIG. 4 illustrates a method associated with DpMRI using the GRAPPA-operator technique.

FIG. 4 illustrates a method 400 associated with DpMRI that relies on the Gopr technique. Method 400 may include, at 410, acquiring time-interleaved under-sampled frames. In 2D DpMRI, for an acceleration factor R, R>2, two time-interleaved frames having neighboring lines in k-space may be acquired. In 3D DpMRI, for an acceleration factor R, R>3, three time-interleaved frames having neighboring k-space lines that satisfy a pre-defined relationship may be acquired. In one example, the relationship may include having a line in a first frame and a line in a second frame related by phase-encoding direction and having the line in the first frame and a line in a third frame related by 3D-encoding direction. One skilled in the art will appreciate that other relationships may be employed.

Method 400 also includes, at 420, assembling a reference data set from the time-interleaved frames. The reference data set can be used, at 430, to compute a Gopr. The Gopr can then be used, at 440, to determine data lines missing in the under-sampled frame. The Gopr may be applied repetitively to fill in missing lines. In one example, when parallel processes are available, different sets of neighboring lines can be determined in parallel. It is to be appreciated that method 400 may be performed for both 2D and 3D acquisitions and/or reconstructions.

Figure 5:
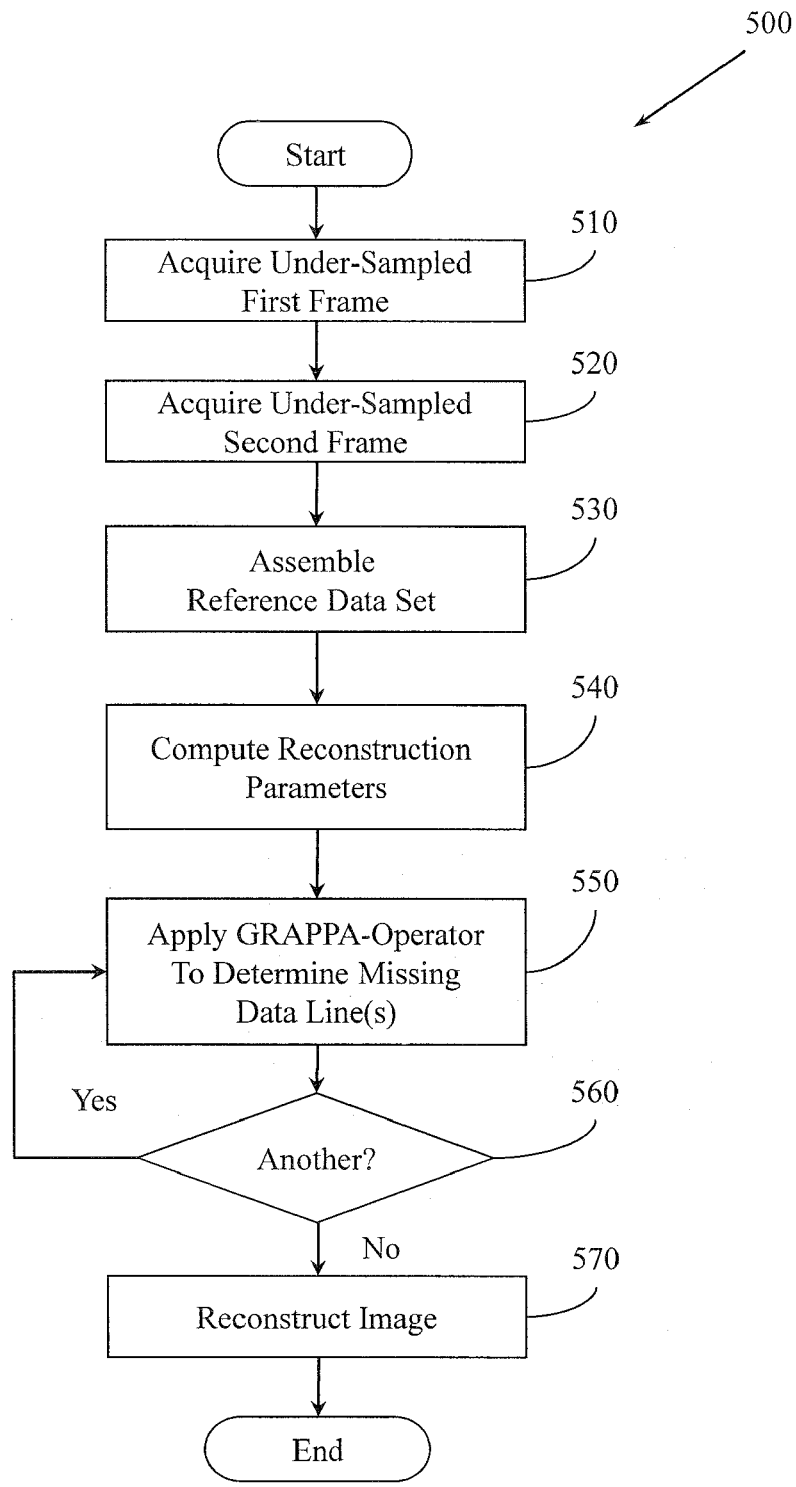
FIG. 5 illustrates a method associated with two dimensional DpMRI using the GRAPPA-operator technique.

FIG. 5 illustrates a method 500 associated with two dimensional DpMRI using the GRAPPA-operator technique. Method 500 includes, at 510, controlling a DpMRI apparatus to acquire a first under-sampled time interleaved frame having a first k-space line. Controlling the DpMRI apparatus may include, for example, sending a control signal, writing a value to a register, calling a subroutine, invoking a method, and so on. In one example, the DpMRI apparatus may be controlled to perform a two-dimensional acquisition. The under-sampling may be performed, for example, at a rate R, R>2.

Method 500 also includes, at 520, controlling the DpMRI apparatus to acquire a second under-sampled time interleaved frame having at least one second k-space line adjacent to the first k-space line. Being "adjacent" to the first k-space line may include, for example, being a "neighboring" line with respect to phase-encoding direction.

Method 500 also includes, at 530, assembling a reference data set from the first under-sampled frame and the second under-sampled frame. Assembling the reference data set may include, for example, writing values to a data structure, writing values to a file, updating a set of registers, and so on. While two frames are described, it is to be appreciated that two or more frames may be acquired. Thus, assembling the reference data set at 530 may include assembling data from two or more time-interleaved frames.

With the assembled data available, method 500 proceeds, at 540, by determining a GRAPPA-operator from neighboring k-space lines in the reference data set. Determining the GRAPPA-operator may include computing different values. For example, determining the GRAPPA-operator may include computing a first set of weights $G_1$ according to:

$$S_{(j,k+\Delta k)} = G_1 S_{(j,k)}$$

where $S(j,k)$ is a point on the first k-space line, where $S_{(j,k+\Delta k)}$ is a point on the shifted k-space line, and where $G_1$ is a set of weights for reconstructing the shifted k-space point from the first k-space point. Determining the GRAPPA-operator may also include computing a generalized set of weights $G_\delta$ according to:

$$S_{(j,k+\delta)} = G_\delta S_{(j,k)}$$

where $S_{(j,k+\delta)}$ is a generally shifted k-space line, and where $G_\delta$ is a set of weights for reconstructing a generally shifted line from a known k-space line.

Determining the GRAPPA-operator may also include computing a second shift according to:

$$S_{(j,k+m\Delta k)} = (G_1)^m \cdot S_{(j,k)},$$

where m corresponds to a shift for producing a missing k-space line that is m lines away from the first k-space line.

Method 500 also includes, at 550 providing a third k-space line that is missing in an under-sampled time frame based, at least in part, on the GRAPPA-operator and the first k-space line. In one example, providing the third k-space line includes applying the second shift to a known k-space line to produce a set of k-space data that can be added to a data set upon which a reconstruction can be performed. The known k-space line may be present in the first under-sampled, the second under-sampled frame, or another frame from which data associated with computing the GRAPPA-operator was computed.

A determination is made, at 560, concerning whether to provide another missing line. If the determination is yes, then processing returns to 550. If the determination is no, then processing moves on to 570. Method 500 includes, at 570, by reconstructing an image from the set of k-space data that includes a data line(s) computed from a known line and the GRAPPA-operator. Reconstructing the image may depend on having a final k-space data set upon which reconstruction can be performed. Therefore, method 500 may also include providing a final k-space data set that includes at least one k-space line not included in either the first under-sampled time frame or the second under-sampled time frame. The final k-space data set may be provided to, for example, a reconstruction logic, a memory, a computer, and so on. In one example, the final k-space data set is a fully Nyquist sampled data set. In one example, the final k-space data set may be constructed, at least in part, from the first under-sampled time frame by repetitive application of the GRAPPA-operator to the first k-space line.

Figure 6:
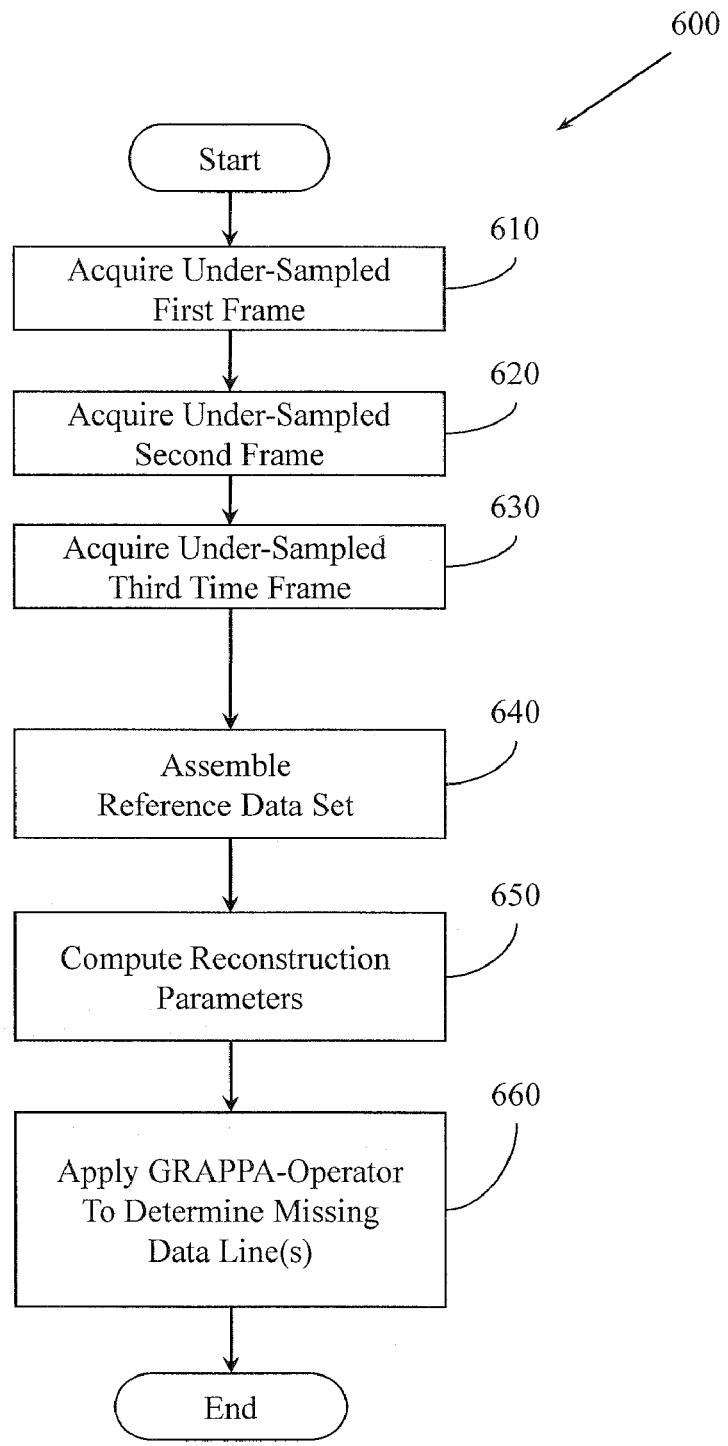
FIG. 6 illustrates a method associated with three dimensional DpMRI using the GRAPPA-operator technique.

FIG. 6 illustrates a method 600 associated with three dimensional DpMRI using the GRAPPA-operator technique. Method 600 includes, at 610, controlling a DpMRI apparatus to acquire a first time-interleaved under-sampled frame. Controlling the DpMRI apparatus may include controlling a logic to perform a desired pulse sequence, controlling a logic to acquire signal from members of a set of coils, and so on. Method 600 also includes, at 620, controlling the DpMRI apparatus to acquire a second time-interleaved under-sampled frame, the second frame having at least one k-space line neighboring in the phase-encoding direction a k-space line in the first under-sampled frame. While neighboring in the phase-encoding direction is described, it is to be appreciated that another neighbor relationship may be employed.

Method 600 also includes, at 630, controlling the DpMRI apparatus to acquire a third time-interleaved under-sampled frame having at least one k-space line neighboring in the 3d-encoding direction a k-space line in the first under-sampled frame. The set of neighbor relationships between the first line in the first frame, the second line in the second frame, and the third line in the third frame are based on a phase-encoding reference and a 3d-encoding reference. One skilled in the art will appreciate that other neighbor relationships may be employed. One skilled in the art will also appreciate that multiple first frames, multiple second frames, and multiple third frames may be acquired and that more than single lines of k-space data may be available to be assembled into a reference data set at 640.

Method 600 also includes, at 640, assembling a reference data set from the first under-sampled frame, the second under-sampled frame, and the third under-sampled frame. Assembling the reference data set may include, for example, writing values to a data structure, writing values to a file, updating a set of registers, and so on.

Method 600 also includes, at 650, determining at least one GRAPPA-operator from the neighboring k-space lines in the reference data set. The GRAPPA-operator may be computed using three dimensional versions of the two-dimensional mathematics described above.

Method 600 also includes, at 660, providing a missing k-space line. The missing k-space line may be provided to a growing data set, a reconstruction loc, a memory, a file, and so on. The k-space line may be missing from the first under-sampled frame or from another under-sampled frame. The missing k-space line may be computed from the at least one GRAPPA-operator and a k-space line in the first under-sampled frame.

Figure 7:
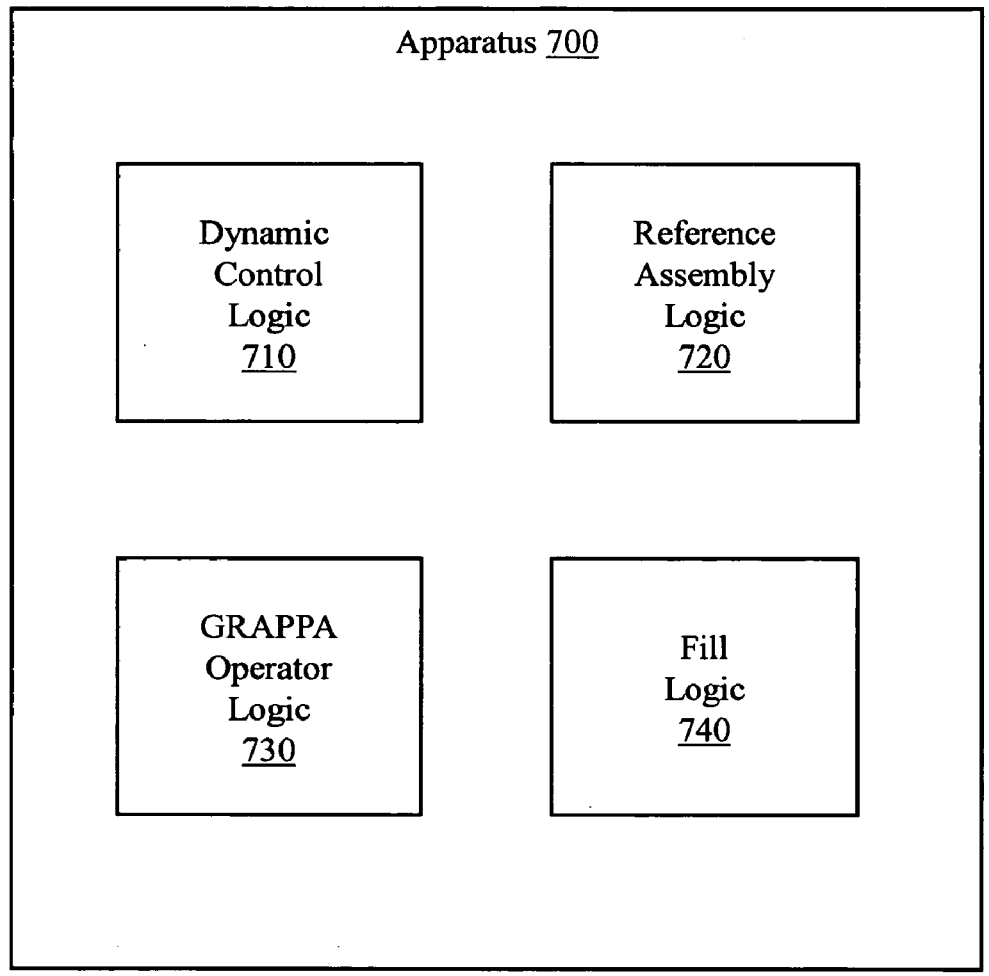
FIG. 7 illustrates an apparatus associated with GRAPPA-operator based DpMRI.

FIG. 7 illustrates an apparatus 700 associated with GRAPPA-operator based DpMRI. In one example, apparatus 700 may be incorporated into a pMRI apparatus. In another example, apparatus 700 may be external to but operably connected to a pMRI apparatus. Apparatus 700 includes a dynamic control logic 710 to control a pMRI apparatus to acquire at least two under-sampled time interleaved frames during a dynamic pMRI session. As the number of coils varies between systems and as the time available for acquisition and reconstruction varies, a different number of under-sampled time interleaved frames may be acquired in different instances of a DpMRI session controlled by apparatus 700. In different examples, the dynamic control logic 710 may control the pMRI apparatus to perform a two dimensional acquisition or a three dimensional acquisition.

Apparatus 700 includes a assembly logic 720 to assemble a reference data set from the at least two under-sampled time interleaved frames. To facilitate computing the GRAPPA-operator, the reference data set is to have at least one pair of neighboring k-space lines.

Apparatus 700 includes a GRAPPA-operator logic 730 to determine a GRAPPA-operator from a pair(s) of neighboring k-space lines in the reference data set. In one example, the GRAPPA-operator logic 730 determines the GRAPPA-operator by computing a first set of weights $G_1$ as described above in association with method 500 (FIG. 5). The GRAPPA-operator logic may also determine the GRAPPA-operator by computing a generalized set of weights $G_8$ as described above in association with method 500 (FIG. 5). The GRAPPA-operator logic may also determine the GRAPPA-operator by computing a second shift as described in connection with method 500 (FIG. 5).

Apparatus 700 also includes a fill logic 740 to provide data missing in an under-sampled frame. The data may be generated based, at least in part, on an acquired k-space line in the under-sampled frame and the GRAPPA-operator computed by the GRAPPA-operator logic 730. For example, the fill logic 740 may provide data missing in an under-sampled frame by applying the second shift to a known k-space line.

Figure 8:
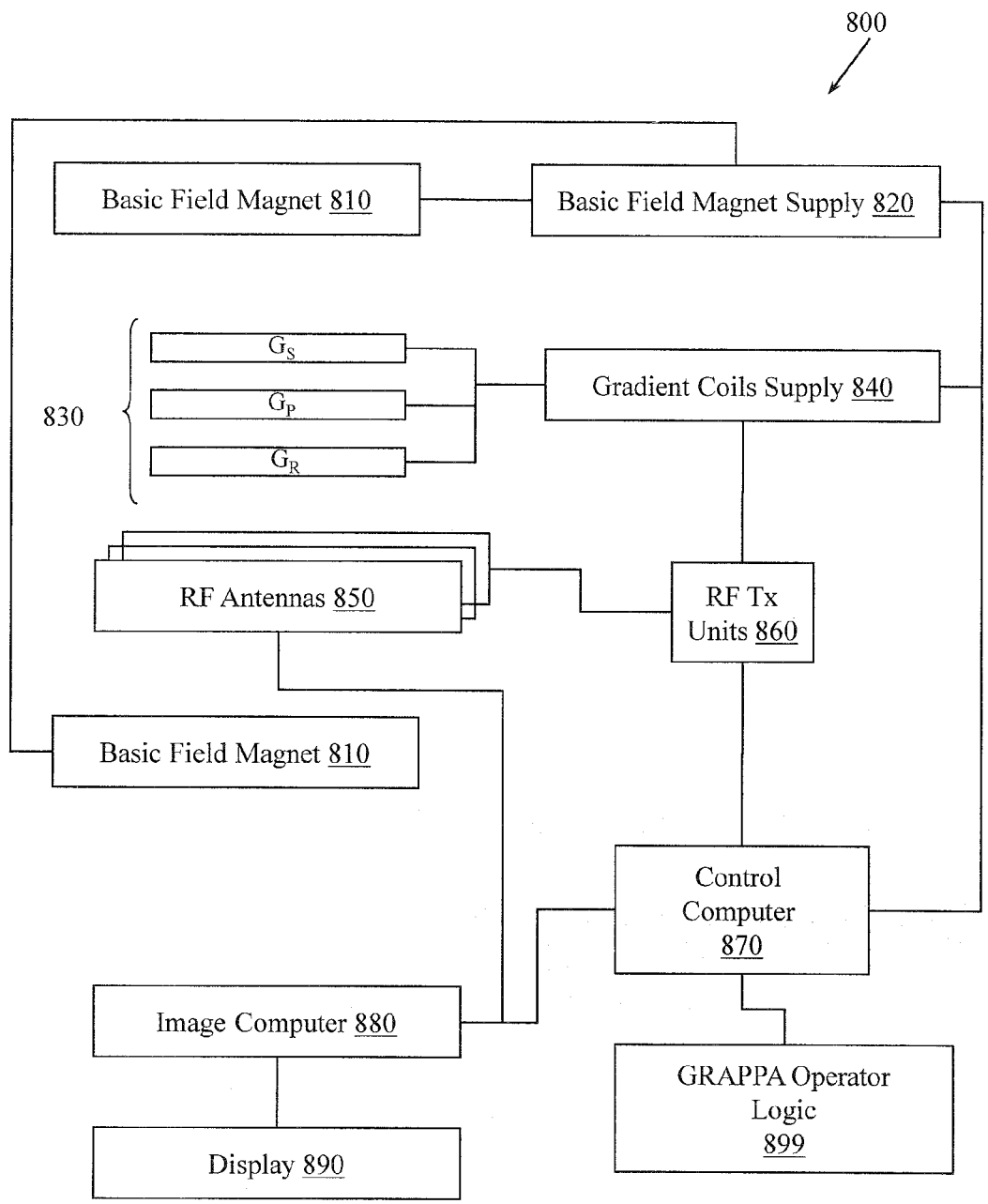
FIG. 8 illustrates an MRI apparatus configured with a GRAPPA-operator logic.

FIG. 8 illustrates an MRI apparatus 800 configured with a GRAPPA-operator logic 899. Logic 899 facilitates computing a GRAPPA-operator that in turns facilitates filling in missing lines in an under sampled data space as described above. The GRAPPA-operator logic 899 may be configured with elements of example apparatus described herein and/or may perform example methods described herein.

The apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being imaged by the MRI apparatus 800. MRI apparatus 800 includes gradient coils 830 configured to emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted during an MRI procedure.

MRI apparatus 800 includes a set of RF antennas 850 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control a pMRI device as described herein. The magnetic resonance signals received from the RF antennas 850 can be employed to generate an image and thus may be subject to a transformation process like a two dimensional fast Fourier Transform that generates pixilated image data. The transformation can be performed by an image computer 880 or other similar processing device. The image data may then be shown on a display 890. While FIG. 8 illustrates an example MRI apparatus 800 that includes various components connected in various ways, it is to be appreciated that other MRI apparatus may include other components connected in other ways.

Figure 9:
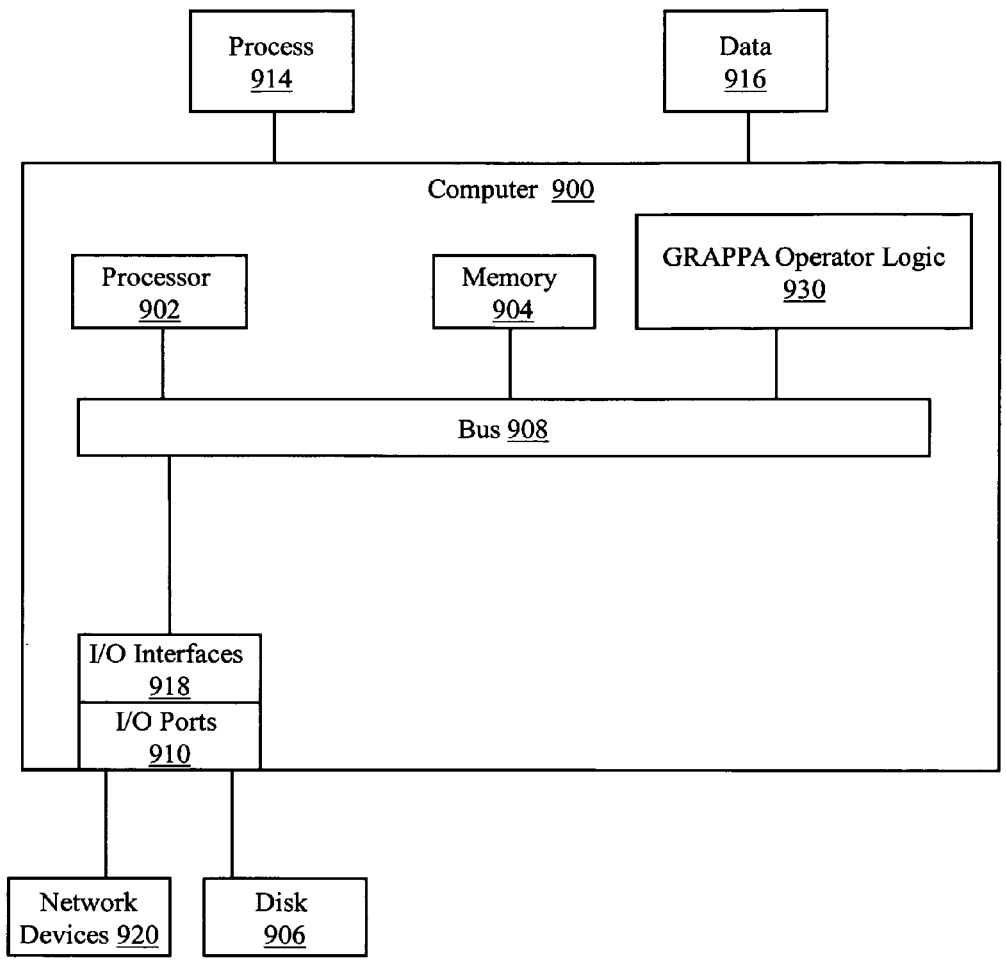
FIG. 9 illustrates an example computing device in which example systems and methods, and equivalents, may operate.

FIG. 9 illustrates an example computing device in which example methods described herein, and equivalents, may operate. The example computing device may be a computer 900 that includes a processor 902, a memory 904, and input/ output ports 910 operably connected by a bus 908. In one example, the computer 900 may include a GRAPPA-operator logic 930 to facilitate controlling image reconstruction with respect to GRAPPA-operator based reconstruction. In different examples, the logic 930 may be implemented in hardware, software, firmware, and/or combinations thereof. While the logic 930 is illustrated as a hardware component attached to the bus 908, it is to be appreciated that in one example, the logic 930 could be implemented in the processor 902.

Thus, logic 930 may provide means (e.g., hardware, software, firmware) for acquiring under sampled time-interleaved frames associated with a pMRI session. The means may be implemented, for example, as an ASIC programmed to control an image reconstruction computer. The means may also be implemented as computer executable instructions that are presented to computer 900 as data 916 that are temporarily stored in memory 904 and then executed by processor 902. Logic 930 may also provide means (e.g., hardware, software, firmware) for assembling an ACS reference set from the under sampled time-interleaved frames. Logic 930 may also provide means (e.g., hardware, software, firmware) for identifying a GRAPPA-operator that identifies a shift between neighboring lines in the ACS reference set. With the GRAPPA-operator available, logic 930 may also provide means for providing a missing k-space line. The missing k-space line may be computed by applying the GRAPPA-operator to a known k-space line.

Generally describing an example configuration of the computer 900, the processor 902 may be a variety of various processors including dual microprocessor and other multi-processor architectures. A memory 904 may include volatile memory and/or non-volatile memory. Non-volatile memory may include, for example, ROM, PROM, and so on. Volatile memory may include, for example, RAM, SRAM, DRAM, and so on.

A disk 906 may be operably connected to the computer 900 via, for example, an input/output interface (e.g., card, device) 918 and an input/output port 910. The disk 906 may be, for example, a magnetic disk drive, a solid state disk drive, a floppy disk drive, a tape drive, a Zip drive, a flash memory card, a memory stick, and so on. Furthermore, the disk 906 may be a CD-ROM drive, a CD-R drive, a CD-RW drive, a DVD ROM, and so on. The memory 904 can store a process 914 and/or a data 916, for example. The disk 906 and/or the memory 904 can store an operating system that controls and allocates resources of the computer 900.

The bus 908 may be a single internal bus interconnect architecture and/or other bus or mesh architectures. While a single bus is illustrated, it is to be appreciated that the computer 900 may communicate with various devices, logics, and peripherals using other busses (e.g., PCIE, 1394, USB, Ethernet). The bus 908 can be types including, for example, a memory bus, a memory controller, a peripheral bus, an external bus, a crossbar switch, and/or a local bus.

The computer 900 may interact with input/output devices via the i/o interfaces 918 and the input/output ports 910. Input/output devices may be, for example, a keyboard, a microphone, a pointing and selection device, cameras, video cards, displays, the disk 906, the network devices 920, and so on. The input/output ports 910 may include, for example, serial ports, parallel ports, and USB ports. The computer 900 can operate in a network environment and thus may be connected to the network devices 920 via the i/o interfaces 918, and/or the i/o ports 910. Through the network devices 920, the computer 900 may interact with a network. Through the network, the computer 900 may be logically connected to remote computers. Networks with which the computer 900 may interact include, but are not limited to, a LAN, a WAN, and other networks.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A non-transitory computer-readable medium storing computer executable instructions that when executed by a computer cause the computer to perform a method, the method comprising:

controlling a dynamic parallel magnetic resonance imaging (DpMRI) apparatus In order to acquire a first under-sampled time interleaved frame having a first k-space line;

controlling the DpMRI apparatus in order to acquire a second under-sampled time interleaved frame having at least one second k-space line adjacent to the first k-space line;

assembling a reference data set from the first under-sampled time frame and the second under-sampled time frame;

determining a GRAPPA-operator from neighboring k-space lines in the reference data set; and providing a third k-space line that is missing in an under-sampled time frame as a function of the GRAPPA-operator and the first k-space line from the first under-sampled time interleaved frame without reference to a fully sampled data set, where the first under-sampled time frame is under-sampled at a rate R, with R>2, where the second under-sampled time frame is also under-sampled at the rate R, and where assembling the reference data set comprises assembling data from less than R under-sampled time frames.

2. The non-transitory computer-readable medium of claim 1, where the DpMRI apparatus performs a two dimensional acquisition.

3. The non-transitory computer-readable medium of claim 1, where determining the GRAPPA-operator includes computing a first set of weights $G_1$ according to:

$$S_{(j, k+\Delta k)} = G_1 S_{(j, k)}$$

where $S_{(j, k)}$ is a point on the first k-space line,
where $S_{(j, k+\Delta k)}$ is a point on a first shifted k-space line, and
where $G_1$ is a set of weights that reconstructs the shifted k-space point from the first k-space point.

4. The non-transitory computer-readable medium of claim 3, where determining the GRAPPA-operator includes computing a generalized set of weights $G_\delta$ according to:

$$S_{(j, k+\delta)} = G_\delta S_{(j, k)}$$

where $S_{(j, k+\delta)}$ is a generally shifted k-space line, and
where $G_\delta$ is a set of weights that reconstructs a generally shifted line from a known k-space line.

5. The non-transitory computer-readable medium of claim 4, where determining the GRAPPA-operator includes computing a second shift according to:

$$S_{(j, k+m\Delta k)} = (G_1)^m S_{(j, k)}$$

where m corresponds to a shift that produces a missing k-space line that is m lines away from the first k-space line.

6. The non-transitory computer-readable medium of claim 5, where providing the third k-space line includes applying the second shift to a known k-space line.

7. The non-transitory computer-readable medium of claim 1, where the method includes providing a final k-space data set that includes at least one k-space line not included in the first under-sampled time frame and the second under-sampled time frame.

8. The non-transitory computer-readable medium of claim 7, where the final k-space data set is a fully Nyquist sampled data set.

9. The non-transitory computer-readable medium of claim 7, where the final k-space data set is constructed, as a function of the first under-sampled time frame by repetitive application of the GRAPPA-operator to the first k-space line.

10. The non-transitory computer-readable medium of claim 7, where the method includes reconstructing an image from the final k-space data set.

11. A non-transitory computer-readable medium storing computer executable instructions that when executed by a computer cause the computer to perform a method, the method comprising:
    controlling a DpMRI apparatus in order to acquire a first time-interleaved under-sampled frame;
    controlling the DpMRI apparatus in order to acquire a second time-interleaved under-sampled frame, the second frame having at least one k-space line neighboring in the phase-encoding direction a k-space line in the first under-sampled frame;
    controlling the DpMRI apparatus in order to acquire a third time-interleaved under-sampled frame having at least one k-space line neighboring in the 3d-encoding direction a k-space line in the first under-sampled frame;
    assembling a reference data set from the first under-sampled frame, the second under-sampled frame, and the third under-sampled frame;
    determining at least one GRAPPA-operator from the neighboring k-space lines in the assembled reference data set; and
    providing a k-space line that is missing in the first under-sampled frame as a function of the at least one GRAPPA-operator and the k-space line in the first under-sampled frame from the first under-sampled time interleaved frame without reference to a fully sampled data set, where the first under-sampled time frame is under-sampled at a rate R, with R>2, where the second under-sampled time frame is also under-sampled at the rate R, and where assembling the reference data set comprises assembling data from less than R under-sampled time frames.

12. An MRI apparatus, comprising:
    a dynamic control logic to control a pMRI apparatus that acquires X under-sampled time interleaved frames during a dynamic pMRI session, the under-sampled time interleaved frames being under-sampled at a degree R, with X being an integer less than R, and R being an integer >2;
    an assembly logic that assembles a reference data set from the under-sampled time interleaved frames, without reference to a fully sampled data set the reference data set having at least one pair of neighboring k-space lines;
    a GRAPPA-operator logic that determines a GRAPPA-operator from one or more pairs of neighboring k-space lines in the reference data set, where the GRAPPA-operator is the operator that shifts data in k-space; and
    a fill logic that provides data missing in an under-sampled frame as a function of an acquired k-space line in the under-sampled frame and the GRAPPA-operator.

13. The MRI apparatus of claim 12, where the dynamic control logic that controls the pMRI apparatus that acquires one of, a two dimensional acquisition and a three dimensional acquisition.

14. The MRI apparatus of claim 12, where the MRI apparatus is incorporated in the pMRI apparatus.

15. The MRI apparatus of claim 12, where the GRAPPA-operator logic determines the GRAPPA-operator by computing a first set of weights $G_1$ according to:

$$S_{(j, k+\Delta k)} = G_1 S_{(j, k)}$$

where $S_{(j, k)}$ is a point on the first k-space line,
where $S_{(j, k+\Delta k)}$ is a point on a first shifted k-space line, and
where $G_1$ is a set of weights that reconstructs the shifted k-space point from the first k-space point.

16. The MRI apparatus of claim 12, where the GRAPPA-operator logic determines the GRAPPA-operator by computing a generalized set of weights $G_\delta$ according to:

$$S_{(j, k+\delta)} = G_\delta S_{(j, k)}$$

where $S_{(j, k+\delta)}$ is a generally shifted k-space line, and
where $G_\delta$ is a set of weights that reconstructs the generally shifted k-space line from the first k-space line.

17. The MRI apparatus of claim 12, where the GRAPPA-operator logic is to determine the GRAPPA-operator by computing a second shift according to:

$$S_{(j, k+m\Delta k)} = (G_1)^m S_{(j, k)}$$

where m corresponds to a shift that produces a missing k-space line that is m lines away from the first k-space line.

18. The MRI apparatus of claim 17, where the fill logic is to provide data missing in an under-sampled frame by applying the second shift to a known k-space line.

* * * * *